United States Patent [19]
Yamane et al.

[11] Patent Number: 6,151,100
[45] Date of Patent: *Nov. 21, 2000

[54] POSITIONING SYSTEM

[75] Inventors: Yukio Yamane, Tokyo; Tsuneo Takashima, Utsunomiya, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/989,027

[22] Filed: Dec. 11, 1997

[30] Foreign Application Priority Data

Dec. 12, 1996  [JP]  Japan .................................... 8-351792

[51] Int. Cl.[7] ............................ G03B 27/42; G03B 27/58
[52] U.S. Cl. ................................. 355/53; 355/72
[58] Field of Search ................... 355/39, 53, 72, 355/75, 76; 356/400, 401; 250/491.1, 492.2

[56] References Cited

U.S. PATENT DOCUMENTS

| | | | |
|---|---|---|---|
| 4,648,725 | 3/1987 | Takahashi | 384/9 |
| 4,869,481 | 9/1989 | Yabu et al. | 269/21 |
| 4,999,506 | 3/1991 | Mizusawa et al. | 250/491.1 |
| 5,015,866 | 5/1991 | Hayashi | 250/548 |
| 5,022,619 | 6/1991 | Mamada | 248/178 |
| 5,182,615 | 1/1993 | Kurosawa et al. | 356/400 |
| 5,228,358 | 7/1993 | Sakino | 74/479 |
| 5,473,424 | 12/1995 | Okumura | 356/139.03 |
| 5,523,843 | 6/1996 | Yamane | 356/363 |
| 5,684,856 | 11/1997 | Itoh et al. | 378/34 |
| 5,726,548 | 3/1998 | Chiba et al. | 318/625 |
| 5,773,953 | 6/1998 | Ukaji et al. | 318/687 |
| 5,858,587 | 1/1999 | Yamane et al. | 430/22 |
| 5,883,702 | 3/1999 | Tokunaga | 355/53 |

*Primary Examiner*—Russell Adams
*Assistant Examiner*—Hung Henry Nguyen
*Attorney, Agent, or Firm*—Fitzpatrick, Cella, Harper & Scinto

[57] ABSTRACT

A positioning system includes an X-Y table having a substrate holding surface for holding a substrate, the holding surface being movable in directions of X and Y axes, respectively, relative to a base table, a rotational table being rotationally movable about each of the X and Y axes and also being movable in a direction of a Z axis which is perpendicular to both of the X and Y axes, a controller for driving controlling the X-Y table and the rotational table and a storage device for storing, beforehand, information regarding rotation about the X or Y axis to be caused during motion of the X-Y table. The controller actuates the rotational table on the basis of the information stored in the storage device to correct rotation about the X or Y axis caused during motion of the X-Y table.

14 Claims, 4 Drawing Sheets

FIG. 5

POSITIONING SYSTEM

FIELD OF THE INVENTION AND RELATED ART

This invention relates to a positioning system usable in an exposure apparatus, for example, for forming a pattern on a flat plate-like object such as a semiconductor wafer or a liquid crystal panel. More particularly, the invention is concerned with a positioning system and an exposure apparatus having the same by which, for production of large density integrated circuit chips such as semiconductor memories or computing elements, the attitude of a workpiece such as a wafer on which a circuit pattern is to be printed can be held accurately to thereby assure high precision exposure.

Generally, a positioning system used in an exposure apparatus, for example, comprises an X-Y stage, a fine-motion stage and a surface position detecting system. The X-Y stage performs motion and positioning in X and Y directions along an X-Y plane. The fine-motion stage is mounted on the X-Y stage and it performs motion and positioning in a Z direction, motion and positioning with respect to a Z axis, and rotation and positioning with respect to the X and Y axes. The surface position detecting system serves to detect the height (level) and tilt of an exposure region of a wafer. In an exposure apparatus having such a positioning system, a wafer is moved at a high speed along the X-Y plane, and the surface position of an exposure region on the wafer is detected. The position is then corrected by use of the fine-motion stage and, after that, the exposure operation starts (this is called a "step-and-repeat procedure"). In this manner, a semiconductor circuit pattern is printed.

In the procedure described above, it is difficult to avoid pitching (longitudinal motion) in the advancement direction at the moments of a start and an end of the stepwise motion. Particularly, pitching at the time of completion of the stepwise motion is influential, because it causes tilt of the wafer surface with respect to the exposure plane. Thus, detection of the surface position cannot be started until the pitching is attenuated sufficiently. Also, the reference plane itself has a problem: that is, there is surface distortion due to the limit of machining precision. Additionally, a stage having a certain weight moves along that surface. Thus, there occurs deformation due to a moving load, which cannot be disregarded. Under these situations, detection of the surface position cannot be started until movement to a predetermined position is completed.

The fine-motion stage then moves to correct the measured surface position and, after completion of the same, the exposure operation can be started. With this procedure, therefore, the motion of the X-Y stage and the measurement of the wafer surface position as well as the correction drive of the fine-motion stage could not be done in parallel, but rather they have to be made sequentially. As a result, it takes a prolonged time for the stage movement operation, including fine motion. This leads to decreased throughput of the apparatus as a whole.

In order to solve such a problem, an angular displacement sensor for detecting tilt of the fine-motion stage with respect to a reference plane may be provided, or an angular acceleration gauge or angular speed gauge for detecting a change in tilt of the fine-motion stage may be provided, to control the tilt of the fine-motion stage on the basis of an output signal from such a sensor, to thereby correct the effect of pitching. On such occasion, however, the provision of a detector results in increased weight of the movement component, which deteriorates high-speed movability of the stage. Also, the addition of a detecting operation with the detecting means or signal transmitting operation to computing means or control means results in prolonged stepwise operation time, or it causes an increase in cost.

SUMMARY OF THE INVENTION

It is an object of the present invention to provide a positioning system usable in an exposure apparatus, for example, for forming a pattern on a planar object (hereinafter "substrate") such as a semiconductor wafer or a liquid crystal panel, for example, by which the positioning time can be reduced without increasing the cost or weight of a movement component on which the substrate is mounted, while retaining the measurement precision, and by which the overall throughput of an apparatus with such a positioning system can be improved.

In accordance with an aspect of the present invention, there is provided a positioning system, comprising: an X-Y table having a substrate holding surface for holding a substrate, said holding surface being movable in directions of X and Y axes, respectively, relative to a base table; a rotational table being rotationally movable about each of the X and Y axes and also being movable in a direction of a Z axis which is perpendicular to both of the X and Y axes; and control means for drive controlling said X-Y table and said rotational table, wherein said control means serves to store rotation information concerning rotation about the X and Y axes, respectively, and functions to correctively drive said rotational table on the basis of the stored rotation information to correct rotation about the X or Y axis caused during motion of said X-Y table.

For the rotation information, numerical values concerning maximum rotational angles in rotational directions about X and Y axes and attenuation characteristics of the same, corresponding to the movement amount of said X-Y table or to the movement amount and movement direction of said X-Y table, may be held as a table or a function, taking the movement amount of said X-Y table or the movement amount and movement direction of said X-Y table as a variable.

For the rotation information, correction values for maximum rotation angles in rotational directions about X and Y axes and attenuation characteristics of the same, corresponding to X-Y coordinates of said X-Y table, may be held as a table or a function, taking the X-Y coordinates of said X-Y table as a variable.

In accordance with another aspect of the present invention, there is provided a positioning system, comprising: an X-Y table having a substrate holding surface for holding a substrate, said holding surface being movable in directions of X and Y axes, respectively, relative to a base table; static pressure bearing means for floating said X-Y table relative to said base table by a predetermined amount; and control means for drive controlling said X-Y table and said rotational table and for controlling a pneumatic pressure to be supplied to said static pressure bearing means, wherein said control means serves to store rotation information concerning rotation about X and Y axes, respectively, and functions to control the supply pressure to said static pressure bearing means on the basis of the stored rotation information, to cancel any rotation of said X-Y table about the X or Y axis caused during movement of said X-Y table.

For the rotation information, numerical values concerning maximum rotational angles in rotational directions about X and Y axes and attenuation characteristics of the same, corresponding to the movement amount of said X-Y table or to the movement amount and movement direction of said X-Y table, may be held as a table or a function, taking the movement amount of said X-Y table or the movement amount and movement direction of said X-Y table as a variable.

For the rotation information, correction values for maximum rotation angles in rotational directions about X and Y axes and attenuation characteristics of the same, corresponding to X-Y coordinates of said X-Y table, may be held as a table or a function, taking the X-Y coordinates of said X-Y table as a variable.

In accordance with a further aspect of the present invention, there is provided a positioning system, comprising: an X-Y table having a substrate holding surface for holding a substrate, said holding surface being movable in directions of X and Y axes, respectively, relative to a base table; a rotational table being rotationally movable about each of the X and Y axes and also being movable in a direction of a Z axis which is perpendicular to both of the X and Y axes; surface position detecting means for detecting a surface position of the substrate; and control means for drive controlling said X-Y table and said rotational table, wherein said control means serves to store an amount of change in the surface position of the substrate caused during movement of said X-Y table and to correct one of a detection signal or a measured value of said surface position detecting means on the basis of the stored amount of change in the surface position of the substrate.

For the stored amount of change in the surface position of the substrate, numerical values concerning maximum rotational angles in rotational directions about X and Y axes and attenuation characteristics of the same, corresponding to the movement amount of said X-Y table or to the movement amount and movement direction of said X-Y table, may be held as a table or a function, taking the movement amount of said X-Y table or the movement amount and movement direction of said X-Y table as a variable.

For the stored amount of change in the surface position of the substrate, correction values for maximum rotation angles in rotational directions about X and Y axes and attenuation characteristics of the same, corresponding to X-Y coordinates of said X-Y table, may be held as a table or a function, taking the X-Y coordinates of said X-Y table as a variable.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First Embodiment

Figure 1:
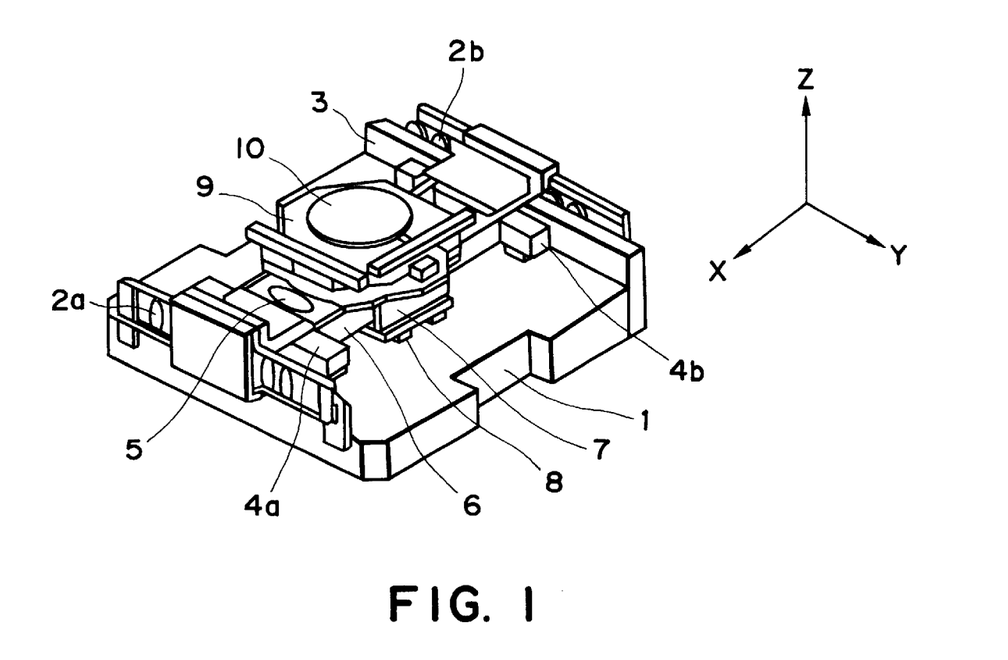
FIG. 1 is a perspective view of the structure of a positioning system according to a first embodiment of the present invention.

FIG. 1 shows the structure of a positioning system according to a first embodiment of the present invention. Denoted in the drawing at 1 is a stage base table, and denoted at 2 (2a and 2b) are Y linear motors for providing drives in a Y direction. Denoted at 3 is a Y guide for providing straight guide in the Y direction. Denoted at 4 (4a and 4b) is a Y stage being movable in the Y direction only and having an X stage (to be described) mounted thereon. Denoted at 5 is an X linear motor, and denoted at 6 is an X guide for providing straight guide in the X direction. Denoted at 7 is an X stage being movable in the X direction. The X linear motor 5 and the X guide 6 are coupled to the Y stage 4, such that the X stage 7 can be moved smoothly both in X and Y directions. Denoted at 8 is an air pad for floating the Y stage 4 and the X stage 7 from the stage base table 1 by a few microns or few tens of microns. Denoted at 9 is a fine-motion stage being movable in a Z direction and also being movable in rotational directions about X, Y and Z axes, respectively. Denoted at 10 is a wafer chuck for holding a wafer by vacuum attraction.

Figure 2:
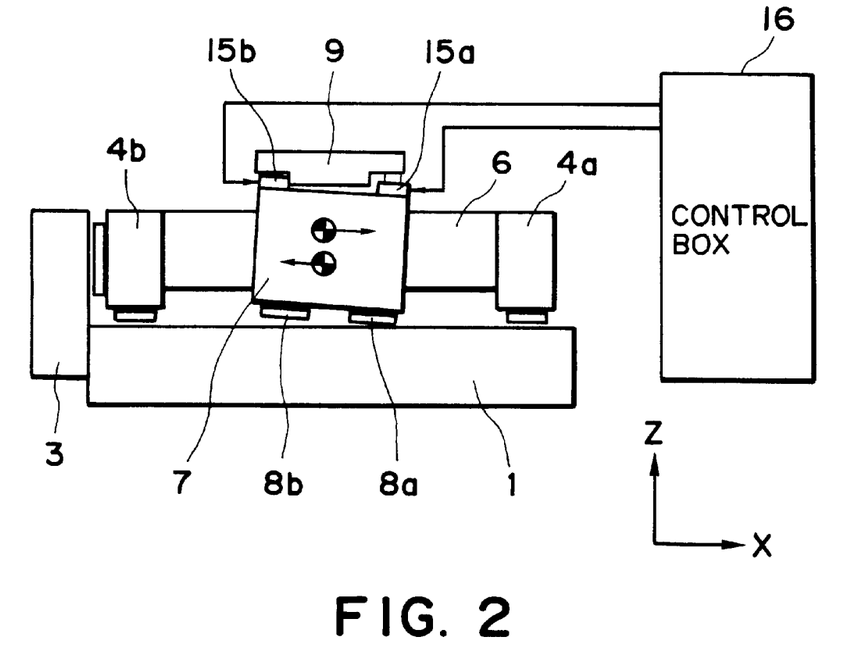
FIG. 2 is a schematic view for explaining operation of the system of FIG. 1

FIG. 2 is a schematic view for explaining the operation of the system of FIG. 1. It is to be noted that, in the drawings to be referred to later, like numerals are assigned to corresponding elements. In FIG. 2, denoted at 15 (15a and 15b) are Z actuators which function also as tilting actuators. More specifically, relatively increasing or decreasing displacements of these actuators in the Z direction will simultaneously provide displacements in rotational directions (tilting) about X and Y axes. Denoted at 16 is a control box for controlling these stage components as a whole.

When stepwise motion in the X direction in FIG. 1 is to be effected, the X linear motor 5 applies thrust to the X stage 7, such that the X stage 7 moves straight along the X guide 6. After movement through a predetermined distance, the X linear motor 5 applies a braking force to the X stage 7 so that the stage stops at a predetermined position. Here, as regards the force produced by the X linear motor, the action line thereof is not always coincident with the gravity center position of the movement component, consisting of the X stage 7, the Z actuator 15 and the fine-motion stage 9. Thus, during an acceleration period and a deceleration period, it functions as a moment force such as illustrated in FIG. 2. On the other hand, as regards the air pad 8 (8a and 8b), the floating force increases, in principle, with a decrease in the gap between it and the stage base table 1, and it decreases with an increase in the gap. Thus, it functions as a retrieving force for retrieving tilt of the X stage 7 to its horizontal position. In summary, during acceleration and deceleration periods of the X stage, there occurs a pitching angle Φ, an angle with which the moment force of the X linear motor 5 and the retrieving force of the air pad 8 are balanced.

The phenomenon described above will be seen quite similarly, in the case of stepwise motion in the Y direction.

After that, and even after acceleration or deceleration of the linear motor is completed, displacement in such a pitching direction remains as vibration. It takes a certain time until the vibration is attenuated. Particularly, as for the pitching at the end of stepwise motion, it functions to cause tilt of the wafer surface with respect to the exposure plane. Thus, the exposure operation cannot be started until the pitching is attenuated sufficiently. As a result, a long time is required for the stepwise motion operation, and it results in decreased throughput of the apparatus as a whole.

Here, the amount of pitching and its attenuation characteristic are determined by the acceleration and acceleration period with the linear motor, the retrieving force and viscosity resistance with the air pad, and the gravity center position and inertia moment of the movement component. Among them, those other than the acceleration and the acceleration period are values inherent to the system. Also, the acceleration and acceleration period of the linear motor are determined in accordance with the amount of stepwise motion. Thus, once the amount of stepwise motion is given, the pitching amount and its attenuation characteristic can be detected definitely, beforehand.

This embodiment is based on the point described above, and the pitching amount corresponding to the stepwise motion amount as well as its attenuation characteristic are stored in the form of a table or function. The drive control is then made so as to cancel the pitching.

More specifically, pitching amounts corresponding to various stepwise motion amounts as well as attenuation characteristics of them are first determined through calculation, and they are stored in the control box 16, in the form of a table or function. Then, as shown in FIG. 2, at the end of the step motion, the Z actuators 15 (15a, 15b and 15c) are drive controlled through the control box 16 so as to just cancel a pitching amount and its attenuation having been stored. With this cancellation, even if there is pitching of the X stage 7, the fine-motion stage 9 can be kept in parallel with the image plane constantly. Therefore, the exposure operation can be started promptly, without the necessity of waiting for convergence of pitching.

In place of determining the pitching amounts and attenuation characteristics through calculation, stepwise motions corresponding to various stepwise movement amounts may be done when the system is shipped out from the factory, and pitching amounts may be measured directly. This will enable a more accurate correction operation, taking individual machine differences into consideration.

Alternatively, measurement of pitching may be made at the time of on-site setting, or it may be made as one of initial operation sequences during its practical operation. This will enable a more accurate correction operation, taking the state of setting of the system into consideration.

In accordance with this embodiment of the present invention described above, pitching amounts corresponding to stepwise movement amounts are detected beforehand, and, at the end of pitching, tilting operation of the fine-motion stage is controlled so as to correct the pitching amount. Thus, the positioning time can be reduced and the overall throughput of the apparatus can be improved. Also, since there is no necessity of adding a displacement sensor, an angular acceleration gauge, an angular speed gauge or the like, unwanted increase in the weight or cost of the movement component can be avoided.

Second Embodiment

Figure 3:
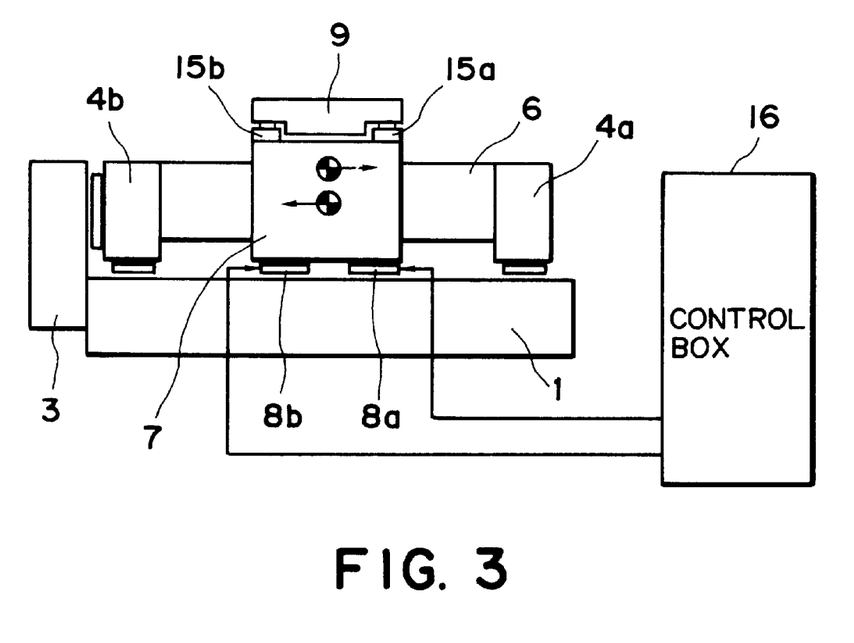
FIG. 3 is a schematic view for explaining operation of a positioning system according to a second embodiment of the present invention.

FIG. 3 is a view similar to FIG. 2, and it shows a second embodiment of the present invention.

In the second embodiment, for correction of the pitching, the Z actuator 15 of the preceding embodiment is not used but, rather, the pneumatic pressure to be supplied to the air pad 8 is changed dynamically.

More specifically, as shown in FIG. 3, the supply pressure to the air pad 8a in the advancement direction and that to the air pad 8b on the opposite side are independently and dynamically adjusted. Similarly to the first embodiment, the pitching amounts and attenuation characteristics of the same having been determined through calculation or having been measured at the time of shipment from the factory, at the time of on-site setting, or during the initial operation sequence, are stored in the control box 16. At the end of a step movement operation, the supplied pneumatic pressures to the air pads 8a and 8b are dynamically changed under the control through the control box 16, so as to cancel the pitching.

Third Embodiment

In the third embodiment of the present invention, the pitching and its attenuation characteristic data are not held as a table or function, taking only the stepwise motion amount as a parameter. Rather, it is held also as a table or function corresponding to the X-Y coordinates of the stage.

Because of non-uniformness of produced thrust of linear motors or differences in thrust balance with position, there are cases where the state of pitching varies with X-Y coordinates. In order to compensate for this, pitching amounts and attenuation characteristic data of the same taking the stepwise motion amount and X-Y coordinates as parameters, may be determined beforehand through calculation. Alternatively, they may be measured at the time of shipment from the factory, at the time of on-site setting or during the initial operation sequence. Then, they may be stored in the control box 16 in the form of a table or function. At the end of the stepwise motion, compensation may be made with the operation of the Z actuator 15, like the first embodiment, or alternatively, with the operation of the air pad 8, like the second embodiment.

Fourth Embodiment

Figure 4:
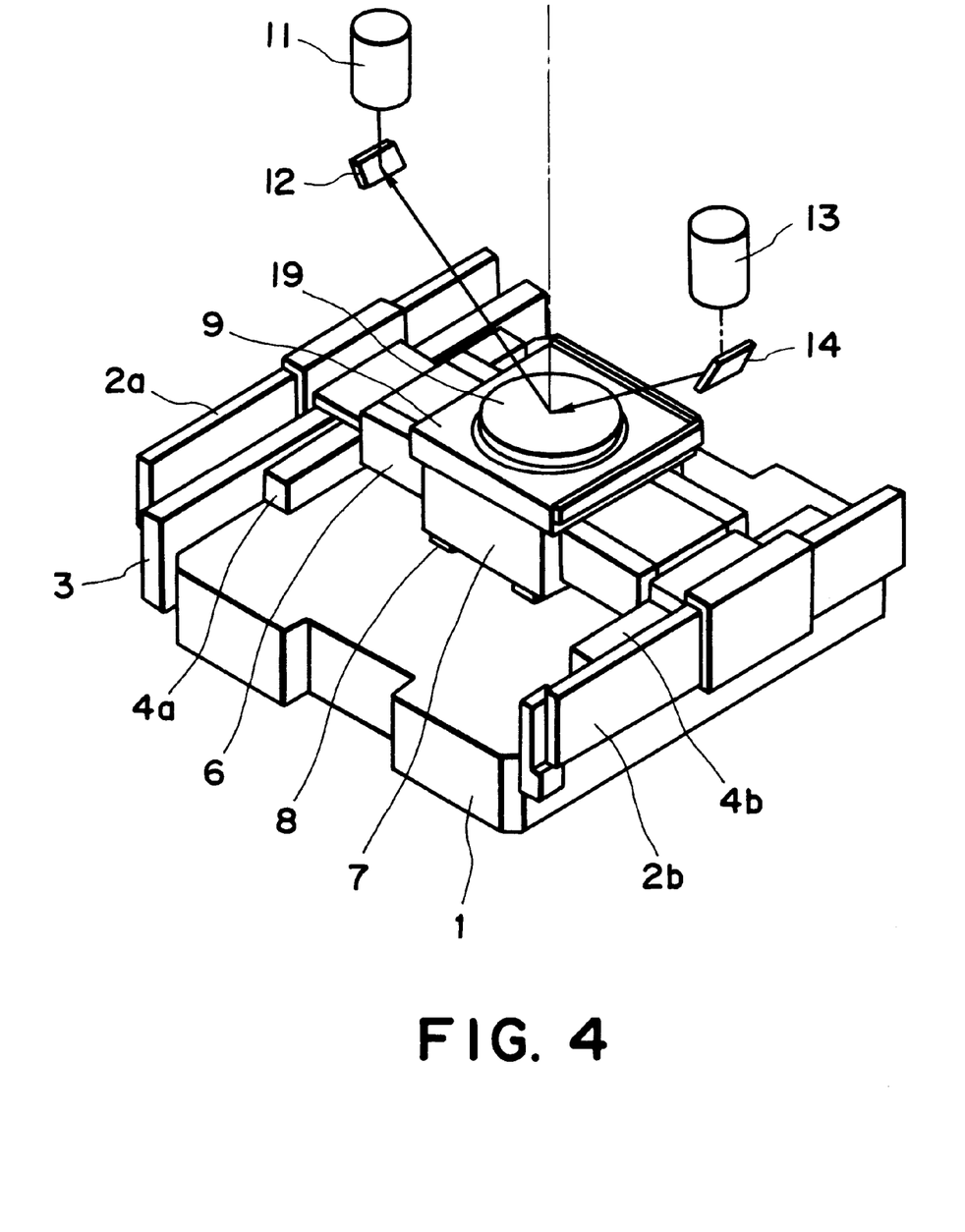
FIG. 4 is a perspective view of the structure of a positioning system according to another embodiment of the present invention.

FIG. 4 illustrates a fourth embodiment of the present invention. Denoted in the drawing at 19 is a wafer which is held fixedly through vacuum attraction. Denoted at 11 is light projecting means for measurement of the surface position of a wafer 19. Denoted at 12 is a reflection mirror for directing illumination light from the light projecting means 11 to an exposure region and a portion around it, of the wafer 19. Denoted at 13 is surface position detecting means for detecting the level and tilt of the exposure region on the wafer 19. Denoted at 14 is a reflection mirror for directing a reflected portion of the surface position measurement light, from the wafer 19, to the surface position detecting means 13.

Figure 5:
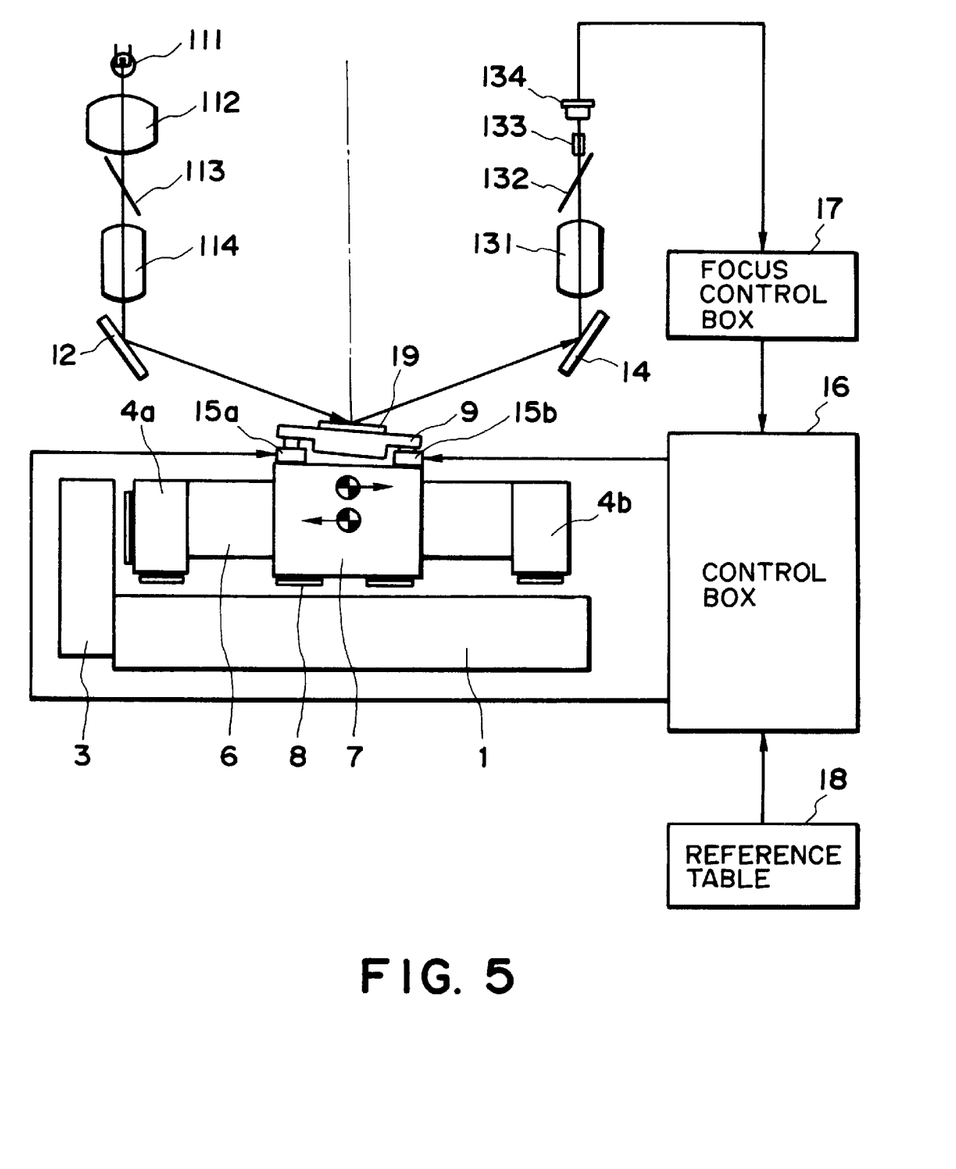
FIG. 5 is a schematic view for explaining operation of the system of FIG. 4.

FIG. 5 is a schematic view for explaining the operation of the system of FIG. 4. Only two actuators 15 (15a and 15b) are illustrated in the drawing, for simplification. However, at least three or more actuators are necessary to provide movability in rotational directions about X and Y axes, respectively. Denoted at 16 is a control box for controlling the stage as a whole. Denoted at 17 is a focus control box for detecting the level and tilt of an exposure region on the wafer 19, on the basis of a detection signal from the surface position detecting means 13. Denoted at 18 is a reference table wherein the relation between changes in the level and tilt of the wafer 19 with respect to an image plane and the stepwise motion amounts and X-Y coordinates, having been determined beforehand, are stored.

Denoted at 111 is a light source such as a white light lamp, for example, and denoted at 112 is a collimator lens for transforming the light from the light source 111 into parallel light having an approximately uniform sectional intensity distribution. Denoted at 113 is a slit member of prism-like shape, having plural openings (e.g., five pinholes). Denoted at 114 is a light projecting lens system which comprises a dual telecentric system and which serves to direct, via a mirror 12, plural light beams passed through the openings of the slit member 113, toward measurement points on the wafer 19 surface. The elements 111, 112, 113 and 114 provide the light projecting means 11 described above.

Denoted at 131 is a light receiving lens system which comprises a dual telecentric system and which receives, via a mirror 14, plural measurement points from the wafer 19. Denoted at 132 are pinhole images as defined by the light receiving lens 131, in relation to associated measurement points on the wafer 19. Denoted at 133 are correction optical systems (only one being illustrated in the drawing, for simplicity) for re-imaging the lights from the pinhole images 132, upon a detection plane of photoelectric converting means (to be described later), in substantially the same size. Denoted at 134 is photoelectric converting means which comprises a two-dimensional CCD, for example. The elements 131, 133 and 134 provide the surface position detecting means 13 described above.

The operation of the positioning system of this embodiment will be described.

When stepwise motion in the X direction, for example, in FIG. 4 is to be done, the X linear motor (not shown) applies thrust to the X stage 7, such that the X stage 7 moves straight along the X guide 6. After movement through a predetermined distance, the X linear motor applies a braking force to the X stage 7 so that the stage stops at a predetermined position. Subsequently, the light projected from the light source 111 is transformed by the collimator lens 112 into substantially parallel light, and it is emitted from the lens 112. The light from the lens 112 goes through the slit member, whereby plural separate measurement light beams are defined. These light beams are directed via the light projecting lens 114 and the mirror 12 and are projected on measurement points on the exposure region and a portion around it, upon the wafer 19 surface. Measurement lights are reflected by the wafer 19 surface and, by means of the mirror 14 and the light receiving lens 131, plural pinhole images 132 corresponding to associated measurement points, respectively, are defined. These images are then re-imaged by the correction optical systems 133, upon the photoelectric converting means 134. The photoelectric converting means 134 then converts them into electric signals which represent the levels (heights) of the measurement points. These signals are applied to the focus control box 17, whereby the level of each measurement point with respect to a certain reference plane, being predetermined, is detected. Subsequently, from an average of the levels of the measurement points, the level of the exposure region with respect to the reference plane is calculated. Also, from mutual differences among the levels of the measurement points, deviations of the exposure region in rotational directions (tilting) about the X and Y axes, that is, tilt of the exposure region, are calculated. In this manner, the level and tilt of the exposure region with respect to the image plane of a projection lens (not shown), attributable to non-uniformness of thickness of the wafer 19 or to a wedge-like shape or warp of the wafer, can be detected.

Here, like the first embodiment, as regards the force produced by the X linear motor, the action line thereof is not always coincident with the gravity center position of the X stage 7. Thus, during an acceleration period and a deceleration period, it functions as a moment force such as illustrated in FIG. 2. On the other hand, as regards the air pad 8, the floating force increases, in principle, with a decrease in the gap between it and the stage base table 1, and it decreases with an increase in the gap. Thus, it functions as a retrieving force for retrieving tilt of the X stage 7 to its horizontal position. In summary, during acceleration and deceleration periods of the X stage 7, there occurs a pitching angle with which the moment force of the X linear motor 5 and the retrieving force of the air pad 8 are balanced.

Also, as regards relative displacement of the fine-motion stage a 9 relative to the X stage, similar phenomenon can be seen, in the same principle. More specifically, in general the fine-motion stage 9 is held through feedback control so that constant height and tilt are maintained stably even during movement of the stage 7. On the other hand, during acceleration and deceleration periods of the X stage 7, there occurs a moment force produced by the X linear motor. Such a moment force functions as a larger moment force because, due to the structure, it is separate away from the gravity center of the fine-motion stage 9 and the action line of the X linear motor. Thus, also in this case, there occurs a pitching angle, of an angle with which the above-described moment force and the retrieving force by the feedback control are balanced.

These phenomena described above will be seen quite similarly, in the case of stepwise motion in the Y direction.

Further, the stage base table cannot be free from distortion of its surface, because of the limit of machining precision. Thus, depending on the position of the stage, the tilt of the top surface varies slightly. As a result, the X stage which is based on the reference provided by the stage base table has a certain tilt error, naturally.

Further, since the X stage, Y stage and fine-motion stage having certain weights move on the stage base table, there occurs inevitable surface distortion due to moving loads.

Thus, for measurement of the height and tilt of the exposure region on the wafer 19, it is required that the step motion is completed and that pitching of the X stage 7 with respect to the stage base table 1 as well as pitching of the fine-motion stage 9 with respect to the X stage 7 are extinguished. Further, in consideration of surface distortion due to the machining precision of the stage base table 1 or surface distortion due to moving loads, the position of measurement of the height and tilt should be coincident with the exposure position. Consequently, in any case, it is necessary that the step motion is completed. Alternatively, if the measurement is to be done when the stepwise motion is not completed, it is necessary that the height and tilt are measured slightly before completion of the stepwise motion where predicted measurement errors are within predetermined tolerable ranges. In summary, motion of the X-Y stage, measurement of the wafer surface position and corrective drive of the fine-motion stage cannot be performed in parallel, but rather they have to be done sequentially. Thus, the time necessary for the stage movement operation is prolonged and, consequently, it takes a long time from a start of stepwise motion to a start of exposure operation. This causes reduced throughput of the apparatus as a whole.

In order to meet such problems, an angular displacement sensor for detecting tilt of the X stage 7 or the fine-motion stage 9 with respect to a reference plane may be provided, or an angular acceleration gauge or angular speed gauge for detecting a change in tilt of the fine-motion stage may be provided, to correct a measured value of height or tilt of the wafer 19 on the basis of an output signal from such sensor. On such occasion, however, the provision of a detector results in increased weight of the movement component, which deteriorates high-speed movability of the stage. Also, the addition of a detecting operation with the detecting means or signal transmitting operation to computing means or control means results in prolonged stepwise operation time, or it causes an increase in cost. Additionally, even in such case, it is difficult to detect a tilt component resulting from the machining precision of the stage base table or a tilt component resulting from deformation of the stage base table due to movement loads.

Here, it is to be noted that the amount of relative pitching between the stage base table 1 and the X stage 7 is determined by the acceleration and an acceleration period with the linear motor, the retrieving force and viscosity resistance with the air pad, and the gravity center position and inertia moment of the movement component, consisting of the X stage 7, the Z linear motors 15a and 15b, the fine-motion stage 9 and the elements mounted thereon. Among them, those other than the acceleration and the acceleration period are values inherent to the system. Also, the acceleration and acceleration period of the linear motor are determined in accordance with the amount of stepwise motion. Thus, once the amount of stepwise motion is given, the pitching amount and its attenuation characteristic can be detected definitely, beforehand.

Similarly, the amount of relative pitching between the X stage 7 and the fine-motion stage 9 is determined by acceleration and an acceleration period of the linear motor, a control characteristic of the feedback control such as retrieving force, and the gravity center position and inertial moment of the fine-motion stage 9 and elements mounted thereon. Therefore, once the amount of stepwise motion is given, the pitching amount and attenuation characteristic can be determined definitely, beforehand.

As regards the tilt of the X stage 7 resulting from surface distortion of the stage base table 1, due to the machining precision or to moving loads, it may be detected by measurement beforehand. Then, it can be determined solely on the basis of the position of the X-Y stage. Thus, it can be determined definitely, once the X-Y coordinates are given.

Further, a height error of the exposure region on the wafer 19 resulting from the tilt of the stage such as described above is determined on the basis of the positional relationship between the wafer 19 and the optical axis of the projection lens, namely, by the X-Y coordinates of the stage. Thus, it can be determined definitely, once the X-Y coordinates are given.

The present embodiment is based on the point described above, and measurement of height and tilt of the wafer 19 is made in a relatively earlier period during movement of the stage, for example, in a constant-speed movement period or in a deceleration period. An error in measured value resulting from this is stored in the form of a table or function related to the stepwise motion amount and X-Y coordinates, beforehand. It is corrected with respect to a measured value and, with this procedure, the total stepwise motion time can be reduced while maintaining the measurement precision.

More specifically, relative pitching amounts between the stage base table 1 and the X stage 7 corresponding to various stepwise motion amounts, during a constant-speed movement period or deceleration period, for example, as well as relative pitching amounts between the X stage and the fine-motion stage 9 on such occasions, may be detected by calculation. Alternatively, these pitching amounts may be measured at the time of inspection in the manufacturing factory and they may be held in the reference table 18, in the form of a table or function. Then, in a similar way, at the time of inspection in the factory, for example, tilt of the X stage 7 resulting from surface distortion due to machining precision of the stage base table 1 or from surface precision due to moving loads, may be measured and it may be stored in the reference table 18 in the form of a table or function, for example.

In practical operation of the system, in the course of the stage motion such as during a constant-speed movement period or deceleration period, for example, the height and tilt of the exposure region on the wafer 19 are measured in accordance with the sequential operations described hereinbefore. The focus control box 17 then applies measured values of height and tilt, to the control box 16. Also, from the reference table 18, numerical values concerning the measurement error having been stored therein are transmitted to the control box 16. These operations may be performed every time the stepwise motion is done or, alternatively, they may be performed at once beforehand at the time of a start of sequential exposure operation. From the measured values of height and tilt and from the numerical values having been stored, the control box 16 calculates the amount of drive of the Z actuator 15 (15a and 15b) necessary for bringing the height and tilt of the exposure region of the wafer 19 at the exposure operation performing position, into exact coincidence with the image plane of the projection lens, and then it applies a corresponding drive signal to the Z actuator. Thus, the Z actuator 15 changes the height and tilt of the fine-motion stage 19, so that the exposure region on the wafer 19 at the exposure operation performing position is exactly registered with the image plane of the projection lens.

In this stage of operation described above, however, there remain pitching errors resulting from the stage motion as described hereinbefore. Thus, it is not always necessary that the height or tilt of the wafer 19 at moments is completely registered with the image plane. Subsequently, movement of the X stage 7 is completed, and it reaches a target position where the exposure operation is to be done, whereby stabilization is completed. Promptly after it, the exposure operation starts. After completion of the exposure operation, a subsequent stepwise motion is initiated. In this manner, movement of the X-Y stage, measurement of the wafer surface position and corrective drive of the fine-motion stage are performed in parallel. This effectively reduces the time necessary for stage movement operation, including fine motion, and as a result it leads to improved overall throughput of the apparatus.

While in the embodiment described above the relative pitching amount between the stage base table 1 and the X stage 7 as well as relative pitching amount between the X stage 7 and the fine-motion stage 9 are stored in the form of a table or function corresponding to the stepwise motion amount, they may be held as a table or function with the addition of the stage X-Y coordinates. On such occasion, a higher precision correction operation will be assured, taking non-uniformness of produced thrusts of linear motors, or a variation in the state of pitching with the X-Y coordinates due to a difference in thrust balance with position, into consideration.

Measurements described hereinbefore may be done during on-site setting of the system or they may be made in the course of an initial operation sequence during practical use of the system. This will assure a more accurate correction operation, taking the state of setting of the system into consideration.

In the embodiment described above, various pitching amounts are separately detected by calculations or measurements and they are simply stored. As an alternative, on the basis of the values obtained separately through calculation or measurement, a correction value with which the measured value of surface position of the wafer is to be corrected finally, may be calculated, and it may be stored in the reference table 18. Further, without calculating or measuring the pitching amounts individually, they may be measured and stored integrally, at the inspection in the factory, at the on-site setting of the system or during the initial operation sequence in practical use of the system, as steady errors of height and tilt in the measurement of wafer surface position, concerning various stepwise motion amounts or X-Y coordinates. In such a case, the number of items to be measured is reduced and the quantity of data to be stored is reduced. Thus, the correction operation will be simpler.

While the invention has been described with reference to the structures disclosed herein, it is not confined to the details set forth and this application is intended to cover such modifications or changes as may come within the purposes of the improvements or the scope of the following claims.

What is claimed is:

1. A positioning system, comprising:
    an X-Y table having a substrate holding surface for holding a substrate, said holding surface being movable in directions of X and Y axes, respectively, relative to a base table;
    a rotational table being rotationally movable about X and Y axes, respectively; and
    control means for driving controlling said X-Y table and said rotational table, wherein said control means comprises means for storing, beforehand, information regarding rotation about the X or Y axis to be caused during motion of said X-Y table, wherein the information is produced in the form of a table or a function in relation to a movement amount of said X-Y table or to a movement amount and a movement direction of said X-Y table, and said control means corrects, beforehand, the rotation about the X or Y axis to be caused during motion of said X-Y table.

2. A positioning system, comprising:
    an X-Y table having a substrate holding surface for holding a substrate, said holding surface being movable in directions of X and Y axes, respectively, relative to a base table;
    a rotational table being rotationally movable about each of the X and Y axes and also being movable in a direction of a Z axis which is perpendicular to both of the X and Y axes;
    control means for driving controlling said X-Y table and said rotational table; and
    storing means for storing, beforehand, information regarding rotation about the X or Y axis to be caused during motion of said X-Y table,
    wherein said control means actuates said rotational table on the basis of the information stored in said storing means to correct rotation about the X or Y axis caused during motion of said X-Y table,
    wherein said storing means comprises means for storing, as the rotation information, numerical values concerning rotational angles in rotational directions about the X and Y axes and attenuation characteristics of the same, corresponding to a movement amount of said X-Y table or to a movement amount and movement direction of said X-Y table, the numerical values being stored in the form of a table or a function, in accordance with the movement amount of said X-Y table or the movement amount and movement direction of said X-Y table.

3. A positioning system, comprising:
    an X-Y table having a substrate holding surface for holding a substrate, said holding surface being movable in directions of X and Y axes, respectively, relative to a base table;
    a rotational table being rotationally movable about each of the X and Y axes and also being movable in a direction of a Z axis which is perpendicular to both of the X and Y axes;
    control means for driving controlling said X-Y table and said rotational table; and
    storing means for storing, beforehand, information regarding rotation about the X or Y axis to be caused during motion of said X-Y table,
    wherein said control means actuates said rotational table on the basis of the information stored in said storing means to correct rotation about the X or Y axis caused during motion of said X-Y table,
    wherein said storing means comprises means for storing, as the rotation information, correction values for rotational angles in rotational directions about the X and Y axes and attenuation characteristics of the same, corresponding to X-Y coordinates of said X-Y table, the correction values being stored in the form of a table or a function, in accordance with the X-Y coordinates of said X-Y table.

4. A positioning system, comprising:
    an X-Y table having a substrate holding surface for holding a substrate, said holding surface being movable in directions of X and Y axes, respectively, relative to a base table;
    static pressure bearing means for floating said X-Y table relative to said base table by a predetermined amount;
    control means for driving controlling said X-Y table and for controlling a pneumatic pressure to be supplied to said static pressure bearing means; and
    storing means for storing, beforehand, information regarding rotation about the X or Y axis to be caused during motion of said X-Y table,
    wherein said control means controls the supply pressure to said static pressure bearing means on the basis of the information stored in said storing means to cancel any rotation of said X-Y table about the X or Y axis caused during movement of said X-Y table,
    wherein said storing means comprises means for storing, as the rotation information, numerical values concerning rotational angles in rotational directions about the X and Y axes and attenuation characteristics of the same, corresponding to a movement amount of said X-Y table or to a movement amount and a movement direction of said X-Y table, the numerical values being stored in the form of a table or a function, in accordance with the movement amount of said X-Y table or the movement amount and movement direction of said X-Y table.

5. A positioning system, comprising:
    an X-Y table having a substrate holding surface for holding a substrate, said holding surface being movable in directions of X and Y axes, respectively, relative to a base table;
    static pressure bearing means for floating said X-Y table relative to said base table by a Predetermined amount;
    control means for driving controlling said X-Y table and for controlling a pneumatic pressure to be supplied to said static pressure bearing means; and storing means for storing, beforehand, information regarding rotation about the X or Y axis to be caused during motion of said X-Y table, wherein said control means controls the supply pressure to said static Pressure bearing means on the basis of the information stored in said storing means to cancel any rotation of said X-Y table about the X or Y axis caused during movement of said X-Y table, wherein said storing means comprises means for storing, as the rotation information, correction values for rotational angles in rotational directions about the X and Y axes and attenuation characteristics of the same, corresponding to X-Y coordinates of said X-Y table, the correction values being stored in the form of a table or a function, in accordance with the X-Y coordinates of said X-Y table.

6. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the X and Y axes;

surface position detecting means for detecting a surface position of the substrate;

control means for drive controlling said X-Y table and said rotational table; and storing means for storing, beforehand, an amount of change in the surface position of the substrate to be caused during movement of said X-Y table, wherein said control means corrects one of a detection signal and a measured value of said surface position detecting means on the basis of the amount of change in the surface position of the substrate, wherein said storing means comprises means for storing, as the stored amount of change in the surface position of the substrate, numerical values concerning rotational angles in rotational directions about the X and Y axes and attenuation characteristics of the same, corresponding to a movement amount of said X-Y table or to a movement amount and a movement direction of said X-Y table, the numerical values being stored in the form of a table or a function, in accordance with the movement amount of said X-Y table or the movement amount and movement direction of said X-Y table.

7. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the x and Y axes;

surface position detecting means for detecting a surface position of the substrate;

control means for drive controlling said X-Y table and said rotational table; and storing means for storing, beforehand, an amount of change in the surface position of the substrate to be caused during movement of said X-Y table, wherein said control means corrects one of a detection signal and a measured value of said surface position detecting means on the basis of the amount of change in the surface position of the substrate, wherein said storing means comprises means for storing, as the stored amount of change in the surface position of the substrate, correction values for rotational angles in rotational directions about the X and Y axes and attenuation characteristics of the same, corresponding to X-Y coordinates of said X-Y table, the correction values being stored in the form of a table or a function, in accordance with the X-Y coordinates of said X-Y table.

8. A system according to claim 1, wherein said means for storing stores, as the rotation information, numerical values concerning rotational angles in rotational directions about the X and Y axes or attenuation characteristics of the same.

9. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the X and Y axes;

control means for driving controlling said X-Y table and said rotational table; and storing means for storing, beforehand, information regarding rotation about the X or Y axis to be caused during motion of said X-Y table, wherein said control means actuates said rotational table on the basis of the information stored in said storing means to correct rotation about the X or Y axis caused during motion of said X-Y table, and wherein said storing means comprises means for storing, as the rotation information, numerical values concerning rotational angles in rotational directions about the X and Y axes or attenuation characteristics of the same, corresponding to a movement amount of said X-Y table or to a movement amount and movement direction of said X-Y table, the numerical values being stored in the form of a table or a function, in accordance with the movement amount of said X-Y table or the movement amount and movement direction of said X-Y table.

10. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the X and Y axes;

control means for driving controlling said X-Y table and said rotational table; and storing means for storing, beforehand, information regarding rotation about the X or Y axis to be caused during motion of said X-Y table, wherein said control means actuates said rotational table on the basis of the information stored in said storing means to correct rotation about the X or Y axis caused during motion of said X-Y table, and wherein said storing means comprises means for storing, as the rotation information, correction values for rotational angles in rotational directions about the X and Y axes or attenuation characteristics of the same, corresponding to X-Y coordinates of said X-Y table, the correction values being stored in the form of a table or a function, in accordance with the X-Y coordinates of said X-Y table.

11. A positioning system, comprising:

an X-Y table having a substrate holding surface for holding a substrate, said holding surface being movable in directions of X and Y axes, respectively, relative to a base table;

static pressure bearing means for floating said X-Y table relative to said base table by a predetermined amount;

control means for driving controlling said X-Y table and for controlling a pneumatic pressure to be supplied to said static pressure bearing means; and storing means for storing, beforehand, information regarding rotation about the X and Y axis to be caused during motion of said X-Y table, wherein said control means controls the supply pressure to said static pressure bearing means on the basis of the information stored in said storing means to cancel any rotation of said X-Y table about the X or Y axis caused during movement of said X-Y table, and wherein said storing means comprises means for storing, as the rotation information, numerical values concerning rotational angles in rotational directions about the X and Y axes or attenuation characteristics of the same, corresponding to a movement amount of said X-Y table or to a movement amount and a movement direction of said X-Y table, the numerical values being stored in the form of a table or a function, in accordance with the movement amount of said X-Y table or the movement amount and movement direction of said X-Y table.

12. A positioning system, comprising:

an X-Y table having a substrate holding surface for holding a substrate, said holding surface being movable in directions of X and Y axes, respectively, relative to a base table;

static pressure bearing means for floating said X-Y table relative to said base table by a predetermined amount;

control means for driving controlling said X-Y table and for controlling a pneumatic pressure to be supplied to said static pressure bearing means; and storing means for storing, beforehand, information regarding rotation about the X or Y axis to be caused during motion of said X-Y table, wherein said control means controls the supply pressure to said static pressure bearing means on the basis of the information stored in said storing means to cancel any rotation of said X-Y table about the X or Y axis caused during movement of said X-Y table, and wherein said storing means comprises means for storing, as the rotation information, correction values for rotational angles in rotational directions about the X and Y axes or attenuation characteristics of the same, corresponding to X-Y coordinates of said X-Y table, the correction values being stored in the form of a table or a function, in accordance with the X-Y coordinates of said X-Y table.

13. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the X and Y axes;

surface position detecting means for detecting a surface position of the substrate;

control means for drive controlling said X-Y table and said rotational table; and storing means for storing, beforehand, and amount of change in the surface position of the substrate to be caused during movement of said X-Y table, wherein said control means corrects one of a detection signal and a measured value of said surface position detecting means on the basis of the amount of change in the surface position of the substrate, and wherein said storing means comrises means for storing, as the stored amount of change in the surface position of the substrate, numerical values concerning rotational angles in rotational directions about the X and Y axes or attenuation characteristics of the same, corresponding to a movement amount of said X-Y table or to a movement amount and a movement direction of said X-Y table, the numerical values being stored in the form of a table or a function, in accordance with the movement amount of said X-Y table or the movement amount and movement direction of said X-Y table.

14. A positioning system, comprising:

an X-Y table having a substrate holding surface for holding a substrate, said holding surface being movable in directions of X and Y axes, respectively, relative to a base table;

a rotational table being rotationally movable about each of the X and Y axes and also being movable in a direction of a Z axis which is perpendicular to both of the X and Y axis;

surface position detecting means for detecting a surface position of the substrate;

control means for drive controlling said X-Y table and said rotational table; and storing means for storing, beforehand, an amount of change in the surface position of the substrate to be caused during movement of said X-Y table, wherein said control means corrects one of a detection signal and a measured value of said surface position detecting means on the basis of the amount of change in the surface position of the substrate, and wherein said storing means comprises means for storing, as the stored amount of change in the surface position of the substrate, correction values for rotational angles in rotational directions about the X and Y axes or attenuation characteristics of the same, corresponding to X-Y coordinates of said X-Y table, the correction values being stored in the form of a table or a function, in accordance with the X-Y coordinates of said X-Y table.

* * * * *

UNITED STATES PATENT AND TRADEMARK OFFICE
CERTIFICATE OF CORRECTION

PATENT NO. : 6,151,100
DATED : November 21, 2000
INVENTOR(S) : Yukio Yamane, et al.

It is certified that error appears in the above-identified patent and that said Letters Patent is hereby corrected as shown below:

Title page,
Item [56] "Reference Cited" Under "U.S. PATENT DOCUMENTS" "Yamane" should read -- Yamane et al. --.

Column 4,
Line 18, "or" should read -- or a --.

Column 8,
Line 7, "a 9" should read -- 9 -- and "similar" should read -- a similar --.
Line 53, "of" (second occurrence) should read -- of an --.

Column 10,
Line 16, "of" should read -- of a --.

Column 11,
Line 56, "table," should read -- table, and --.

Column 12,
Lines 18 and 46, "table," should read -- table, and --.
Line 63, "Predetermined" should read -- predetermined --.

Column 13,
Line 5, "Pressure" should read -- pressure --.
Line 8, "table" should read -- table, and --.
Line 37, "substrate," should read -- substrate, and --.
Line 56, "x" should read -- X --.

UNITED STATES PATENT AND TRADEMARK OFFICE
CERTIFICATE OF CORRECTION

PATENT NO.    : 6,151,100
DATED         : November 21, 2000
INVENTOR(S)   : Yukio Yamane, et al.

It is certified that error appears in the above-identified patent and that said Letters Patent is hereby corrected as shown below:

Column 14,
Line 2, "substrate," should read -- substrate, and --.

Column 15,
Line 15, "X and Y" should read -- X or Y --.

Signed and Sealed this

Twenty-third Day of October, 2001

Attest:

*Nicholas P. Godici*

NICHOLAS P. GODICI
*Attesting Officer*  *Acting Director of the United States Patent and Trademark Office*